(12) United States Patent
Muraoka et al.

(10) Patent No.: US 9,111,640 B2
(45) Date of Patent: Aug. 18, 2015

(54) NONVOLATILE MEMORY ELEMENT, NONVOLATILE MEMORY DEVICE, AND WRITING METHOD FOR USE IN NONVOLATILE MEMORY ELEMENT

(71) Applicant: Panasonic Intellectual Property Management Co., Ltd., Osaka (JP)

(72) Inventors: Shunsaku Muraoka, Osaka (JP); Zhiqiang Wei, Osaka (JP); Takeshi Takagi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 165 days.

(21) Appl. No.: 13/824,811

(22) PCT Filed: Oct. 15, 2012

(86) PCT No.: PCT/JP2012/006578
§ 371 (c)(1),
(2) Date: Mar. 18, 2013

(87) PCT Pub. No.: WO2013/057912
PCT Pub. Date: Apr. 25, 2013

(65) Prior Publication Data
US 2014/0063909 A1 Mar. 6, 2014

(30) Foreign Application Priority Data
Oct. 18, 2011 (JP) .................................. 2011-228566

(51) Int. Cl.
*G11C 11/56* (2006.01)
*G11C 13/00* (2006.01)
(Continued)

(52) U.S. Cl.
CPC ........ *G11C 11/5685* (2013.01); *G11C 13/0069* (2013.01); *H01L 27/101* (2013.01);
(Continued)

(58) Field of Classification Search
CPC .. H01L 45/146; G11C 13/0007; G11C 13/32; G11C 13/56
USPC .............. 365/148, 158, 163, 100; 257/2, 3, 4, 257/E45.003, 43
See application file for complete search history.

(56) References Cited

U.S. PATENT DOCUMENTS 6,473,332 B1 10/2002 Ignatiev et al.
6,888,745 B2 5/2005 Ehiro et al.
(Continued)

FOREIGN PATENT DOCUMENTS

JP 2004-185756 7/2004
JP 2006-140464 6/2006
(Continued)

OTHER PUBLICATIONS

International Search Report issued Nov. 20, 2012 in corresponding International Application No. PCT/JP2012/006578.
(Continued)

*Primary Examiner* — Richard Elms
*Assistant Examiner* — Jerome LeBoeuf
(74) *Attorney, Agent, or Firm* — Wenderoth, Lind & Ponack, L.L.P.

(57) ABSTRACT

In a nonvolatile memory element, when a voltage value of an electric pulse has a relationship of V2>V1>0 V>V3>V4 and a resistance value of a variable resistance layer has a relationship of R3>R2>R4>R1, the resistance value of the variable resistance layer becomes: R2, when the electric pulse having a voltage value of V2 or greater is applied between electrodes; R4, when the electric pulse having a voltage value of V4 or smaller is applied between the electrodes; R3, when the resistance value of the variable resistance layer is R2 and the electric pulse having a voltage value of V3 is applied between the electrodes; and R1, when the resistance value of the variable resistance layer is R4 and the electric pulse having a voltage value of V1 is applied between the electrodes.

8 Claims, 9 Drawing Sheets

(51) Int. Cl.
*H01L 27/10* (2006.01)
*H01L 45/00* (2006.01)
*H01L 27/24* (2006.01)

(52) U.S. Cl.
CPC ............ *H01L27/2436* (2013.01); *H01L 45/08* (2013.01); *H01L 45/146* (2013.01); *G11C 2013/0073* (2013.01); *G11C 2211/5648* (2013.01)

(56) References Cited

U.S. PATENT DOCUMENTS

| | | | |
|---|---|---|---|
| 7,535,035 B2 | 5/2009 | Baek et al. | |
| 7,965,539 B2 | 6/2011 | Osano et al. | |
| 8,116,125 B2 | 2/2012 | Kim et al. | |
| 8,179,713 B2 | 5/2012 | Kanzawa et al. | |
| 8,395,925 B2* | 3/2013 | Kawai et al. | 365/148 |
| 8,581,224 B2* | 11/2013 | Sandhu et al. | 257/4 |
| 8,854,864 B2* | 10/2014 | Wei et al. | 365/148 |
| 2004/0114429 A1 | 6/2004 | Ehiro et al. | |
| 2006/0097288 A1 | 5/2006 | Baek et al. | |
| 2009/0141546 A1 | 6/2009 | Kim et al. | |
| 2010/0259966 A1 | 10/2010 | Kanzawa et al. | |
| 2010/0271859 A1 | 10/2010 | Osano et al. | |
| 2010/0271860 A1* | 10/2010 | Muraoka et al. | 365/148 |
| 2012/0068148 A1 | 3/2012 | Kawashima et al. | |
| 2012/0099371 A1 | 4/2012 | Kim et al. | |
| 2012/0120712 A1* | 5/2012 | Kawai et al. | 365/148 |
| 2013/0187117 A1* | 7/2013 | Sandhu et al. | 257/4 |
| 2014/0050003 A1* | 2/2014 | Tomotani et al. | 365/51 |
| 2014/0061579 A1* | 3/2014 | Wei et al. | 257/5 |
| 2014/0092668 A1* | 4/2014 | Kim et al. | 365/148 |

FOREIGN PATENT DOCUMENTS

| | | |
|---|---|---|
| JP | 2009-135409 | 6/2009 |
| JP | 2011-198909 | 10/2011 |
| WO | 2009/041041 | 4/2009 |
| WO | 2009/147790 | 12/2009 |
| WO | 2010/029634 | 3/2010 |
| WO | 2011/111361 | 9/2011 |

OTHER PUBLICATIONS

I. G. Baek et al., "Highly Scalable Non-volatile Resistive Memory using Simple Binary Oxide Driven by Asymmetric Unipolar Voltage Pulses", 2004 IEEE International Electron Devices Meeting, IEDM Technical Digest, Dec. 13-15, 2004, pp. 587-590.

Masayuki Fujimoto et al., "High-Speed Resistive Switching of $TiO_2$/TiN Nano-Crystalline Thin Film", Japanese Journal of Applied Physics, vol. 45, No. 11, Mar. 10, 2006, pp. L310-L312.

An Chen et al., "Non-Volatile Resistive Switching for Advanced Memory Applications", 2005 IEEE International Electron Devices Meeting, IEDM Technical Digest, Dec. 5-7, 2005, pp. 746-749.

J. McPherson et al., "Proposed Universal Relationship Between Dielectric Breakdown and Dielectric Constant", 2002 IEEE International Electron Devices Meeting, Dec. 8-11, 2002, pp. 633-636.

Chinese Office Action with Search Report issued Mar. 30, 2015 in corresponding Chinese Application No. 201280003077.3 (with partial English translation).

* cited by examiner

R1

R2

R3

R4

NONVOLATILE MEMORY ELEMENT, NONVOLATILE MEMORY DEVICE, AND WRITING METHOD FOR USE IN NONVOLATILE MEMORY ELEMENT

TECHNICAL FIELD

The present invention relates to a nonvolatile memory element which uses a state variable material whose resistance value changes according to pulse voltages applied.

BACKGROUND ART

Recently, with advances in digital technology, electronic devices, such as portable information devices and home information appliances, have been developed to provide higher functionality. As the electronic devices have been developed to provide higher functionality, miniaturization and an increase in speed of semiconductor elements for use with the electronic devices are making rapid progress. Among them, the use of large-capacity nonvolatile memory devices which are typified by a flash memory has been expanding at a rapid pace. Furthermore, as next-generation nonvolatile memory devices that can replace the flash memory, research and development is advancing on a nonvolatile memory device including a variable resistance nonvolatile memory element, which includes a variable resistance layer having a resistance value that changes reversibly in response to electric signals.

Materials used as variable resistance layers are divided into two general types. One type of materials are oxides of transition metals (Ni, Nb, Ti, Zr, Hf, Co, Fe, Cu, Cr, and the like) disclosed in Patent Literature (PTL) 1 and Non Patent Literature (NPL) 1 to 3, and in particular is an oxide in which an oxygen content atomic percentage is deficient in terms of stoichiometric composition (hereafter referred to as an oxygen-deficient oxide). The other type of materials is perovskite materials ($Pr_{(1-x)}Ca_xMnO_3$ (PCMO), $LaSrMnO_3$ (LSMO), $GdBaCo_xO_y$ (GBCO), and the like).

Furthermore, PTL 2 and 3 disclose a nonvolatile memory element which can, when the latter type that is perovskite material is used as the variable resistance layer, store not only two values (two states, namely, a low resistance state and a high resistance state) but multiple values of three or more values.

CITATION LIST

Patent Literature

[PTL 1]
Japanese Unexamined Patent Application Publication No. 2006-140464
[PTL 2]
U.S. Pat. No. 6,473,332
[PTL 3]
Japanese Unexamined Patent Application Publication No. 2004-185756

Non Patent Literature

[NPL 1]
I. G. Baek et al., Tech. Digest IEDM 2004, p. 587
[NPL 2]
Japanese Journal of Applied Physics Vol 45, 2006, p. L310
[NPL 3]
A. Chen et al., Tech. Digest IEDM 2005, p. 746
[NPL 4]
J. McPherson et al., IEDM 2002, pp. 633-636

SUMMARY OF INVENTION

Technical Problem

In the above-described nonvolatile memory element that stores multiple values, it is expected that the resistance value states each of which constitutes one of the multiple values are stable.

In view of this, the present invention provides a nonvolatile memory element which can be stable at each of the resistance values.

Solution to Problem

A nonvolatile memory element according to an aspect of the present invention includes: a first electrode; a second electrode; and a variable resistance layer which is located between the first electrode and the second electrode, has a resistance value that reversibly changes according to a voltage value of an electric pulse applied between the first electrode and the second electrode, and comprises a metal oxide, wherein the variable resistance layer includes a first metal oxide region connected to the first electrode, and a second metal oxide region connected to the second electrode, the second metal oxide region having an oxygen content atomic percentage higher than an oxygen content atomic percentage of the first metal oxide region, and when V1, V2, V3, V4, V5, and V6 representing voltage values of the electric pulse with respect to the first electrode have a relationship of $V2>V1>V6>0 V>V5>V3>V4$, and R1, R2, R3, and R4 representing resistance values of the variable resistance layer have a relationship of $R3>R2>R4>R1$, the resistance value of the variable resistance layer: becomes R2, when the electric pulse having a voltage value of V2 or greater is applied between the first electrode and the second electrode; and becomes R4, when the electric pulse having a voltage value of V4 or smaller is applied between the first electrode and the second electrode, the resistance value of the variable resistance layer at R2: remains at R2, when the electric pulse having a voltage value of V5 or greater is applied between the first electrode and the second electrode; increases to above R2, when the electric pulse having a voltage value smaller than V5 and greater than V3 is applied between the first electrode and the second electrode; and becomes R3, when the electric pulse having a voltage value of V3 is applied between the first electrode and the second electrode, the resistance value of the variable resistance layer at R3: decreases to below R3, when the electric pulse having a voltage value smaller than V3 and greater than V4 is applied between the first electrode and the second electrode; and becomes R4, when the electric pulse having a voltage value of V4 is applied between the first electrode and the second electrode, the resistance value of the variable resistance layer at R4: remains at R4, when the electric pulse having a voltage value of V6 or smaller is applied between the first electrode and the second electrode; decreases to below R4, when the electric pulse having a voltage value greater than V6 and smaller than V1 is applied between the first electrode and the second electrode; and becomes R1, when the electric pulse having a voltage value of V1 is applied between the first electrode and the second electrode, and the resistance value of the variable resistance layer at R1: increases to above R1, when the electric pulse having a voltage value greater than V1 and smaller than V2 is applied between the first electrode and the second electrode; and becomes R2, when the electric pulse having a voltage value of V2 is applied between the first electrode and the second electrode.

Advantageous Effects of Invention

A nonvolatile memory element according to the present invention realizes a stable multi-value memory.

DESCRIPTION OF EMBODIMENTS

Figure 1:
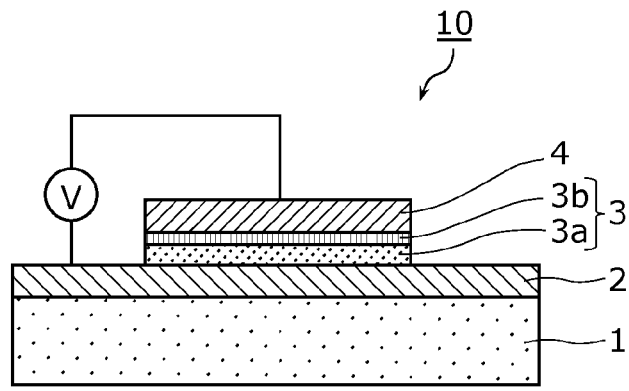
FIG. 1 is a cross-sectional view showing a configuration of a nonvolatile memory element according to Embodiment 1.

A nonvolatile memory element according to a first aspect of the present invention includes: a first electrode; a second electrode; and a variable resistance layer which is located between the first electrode and the second electrode, has a resistance value that reversibly changes according to a voltage value of an electric pulse applied between the first electrode and the second electrode, and comprises a metal oxide, wherein the variable resistance layer includes a first metal oxide region connected to the first electrode, and a second metal oxide region connected to the second electrode, the second metal oxide region having an oxygen content atomic percentage higher than an oxygen content atomic percentage of the first metal oxide region, and when V1, V2, V3, V4, V5, and V6 representing voltage values of the electric pulse with respect to the first electrode have a relationship of V2>V1>V6>0 V>V5>V3>V4, and R1, R2, R3, and R4 representing resistance values of the variable resistance layer have a relationship of R3>R2>R4>R1, the resistance value of the variable resistance layer: becomes R2, when the electric pulse having a voltage value of V2 or greater is applied between the first electrode and the second electrode; and becomes R4, when the electric pulse having a voltage value of V4 or smaller is applied between the first electrode and the second electrode, the resistance value of the variable resistance layer at R2: remains at R2, when the electric pulse having a voltage value of V5 or greater is applied between the first electrode and the second electrode; increases to above R2, when the electric pulse having a voltage value smaller than V5 and greater than V3 is applied between the first electrode and the second electrode; and becomes R3, when the electric pulse having a voltage value of V3 is applied between the first electrode and the second electrode, the resistance value of the variable resistance layer at R3: decreases to below R3, when the electric pulse having a voltage value smaller than V3 and greater than V4 is applied between the first electrode and the second electrode; and becomes R4, when the electric pulse having a voltage value of V4 is applied between the first electrode and the second electrode, the resistance value of the variable resistance layer at R4: remains at R4, when the electric pulse having a voltage value of V6 or smaller is applied between the first electrode and the second electrode; decreases to below R4, when the electric pulse having a voltage value greater than V6 and smaller than V1 is applied between the first electrode and the second electrode; and becomes R1, when the electric pulse having a voltage value of V1 is applied between the first electrode and the second electrode, and the resistance value of the variable resistance layer at R1: increases to above R1, when the electric pulse having a voltage value greater than V1 and smaller than V2 is applied between the first electrode and the second electrode; and becomes R2, when the electric pulse having a voltage value of V2 is applied between the first electrode and the second electrode.

In this manner, the variable resistance layer of the nonvolatile memory element can take four stable resistance states, namely, R1, R2, R3, and R4.

Furthermore, in the first aspect of the present invention, the variable resistance layer may include a local region which is in contact with the second electrode and not in contact with the first electrode, and the local region may include: a first high oxygen concentration region positioned closer to the first electrode; a second high oxygen concentration region positioned closer to the second electrode; and a low oxygen concentration region which is positioned between the first high oxygen concentration region and the second high oxygen concentration region, and has an oxygen content atomic percentage lower than oxygen content atomic percentages of the first high oxygen concentration region and the second high oxygen concentration region.

Furthermore, in the first aspect of the present invention, the local region may be formed to extend across the first metal oxide region and the second metal oxide region, the first high oxygen concentration region may be formed in the first metal oxide region, and the second high oxygen concentration region may be formed in the second metal oxide region.

Furthermore, in the first aspect of the present invention, the variable resistance layer may comprise a transition metal oxide or an aluminum oxide.

Furthermore, in the first aspect of the present invention, the first metal oxide region may comprise an oxide having a composition represented by $TaO_x$, and the second metal oxide region may comprise an oxide having a composition represented by $TaO_y$, where $x<y$.

A nonvolatile memory device according to a second aspect of the present invention is a nonvolatile memory device which includes a plurality of the nonvolatile memory elements according to any of the above-described aspects, the nonvolatile memory device comprising: a plurality of word lines and a plurality of bit lines, the word lines and the bit lines being formed above a semiconductor substrate and arranged to cross each other, and a memory array including the nonvolatile memory elements each of which is provided for a corresponding one of cross-points of the word lines and the bit lines.

Furthermore, in the second aspect of the present invention, a plurality of transistors each of which is connected in series to a corresponding one of the nonvolatile memory elements may be further included.

Furthermore, in the second aspect of the present invention, a plurality of diodes each of which is connected in series to a corresponding one of the nonvolatile memory elements may be further included.

A method of writing for use in a nonvolatile memory element according to a third aspect of the present invention is a method of writing for use in a nonvolatile memory element, wherein the nonvolatile memory element includes: a first electrode; a second electrode; and a variable resistance layer which is located between the first electrode and the second electrode, has a resistance value that reversibly changes according to a voltage value of an electric pulse applied between the first electrode and the second electrode, and comprises a metal oxide, the variable resistance layer includes a first metal oxide region connected to the first electrode, and a second metal oxide region connected to the second electrode, the second metal oxide region having an oxygen content atomic percentage higher than an oxygen content atomic percentage of the first metal oxide region, and when V1, V2, V3, V4, V5, and V6 representing voltage values of the electric pulse with respect to the first electrode have a relationship of $V2>V1>V6>0$ $V>V5>V3>V4$, and R1, R2, R3, and R4 representing resistance values of the variable resistance layer have a relationship of $R3>R2>R4>R1$, the resistance value of the variable resistance layer: becomes R2, when the electric pulse having a voltage value of V2 or greater is applied between the first electrode and the second electrode; and becomes R4, when the electric pulse having a voltage value of V4 or smaller is applied between the first electrode and the second electrode, the resistance value of the variable resistance layer at R2: remains at R2, when the electric pulse having a voltage value of V5 or greater is applied between the first electrode and the second electrode; increases to above R2, when the electric pulse having a voltage value smaller than V5 and greater than V3 is applied between the first electrode and the second electrode; and becomes R3, when the electric pulse having a voltage value of V3 is applied between the first electrode and the second electrode, the resistance value of the variable resistance layer at R3: decreases to below R3, when the electric pulse having a voltage value smaller than V3 and greater than V4 is applied between the first electrode and the second electrode; and becomes R4, when the electric pulse having a voltage value of V4 is applied between the first electrode and the second electrode, the resistance value of the variable resistance layer at R4: remains at R4, when the electric pulse having a voltage value of V6 or smaller is applied between the first electrode and the second electrode; decreases to below R4, when the electric pulse having a voltage value greater than V6 and smaller than V1 is applied between the first electrode and the second electrode; and becomes R1, when the electric pulse having a voltage value of V1 is applied between the first electrode and the second electrode, and the resistance value of the variable resistance layer at R1: increases to above R1, when the electric pulse having a voltage value greater than V1 and smaller than V2 is applied between the first electrode and the second electrode; and becomes R2, when the electric pulse having a voltage value of V2 is applied between the first electrode and the second electrode, the method including: when changing the resistance value of the variable resistance layer from resistance value R1 or resistance value R4 to resistance value R3, applying the electric pulse having a voltage value of V2 between the first electrode and the second electrode to change the resistance value of the variable resistance layer to resistance value R2, and subsequently applying the electric pulse having a voltage value of V3 between the first electrode and the second electrode to change the resistance value of the variable resistance layer to resistance value R3; and when changing the resistance value of the variable resistance layer from resistance value R2 or resistance value R3 to resistance value R1, applying the electric pulse having a voltage value of V4 between the first electrode and the second electrode to change the resistance value of the variable resistance layer to resistance value R4, and subsequently applying the electric pulse having a voltage value of V1 between the first electrode and the second electrode to change the resistance value of the variable resistance layer to resistance value R1.

Hereafter, embodiments of the present invention shall be described with reference to the drawings.

Each of the embodiments described below shows a general or specific example. The numerical values, shapes, materials, structural elements, the arrangement and connection of the structural elements, steps, the processing order of the steps etc. shown in the following embodiments are mere examples, and therefore do not limit the scope of the present invention. Furthermore, among the structural elements in the following embodiments, structural elements not recited in any one of the independent claims indicating the broadest concept are described as arbitrary structural elements.

Embodiment 1

Configuration of Nonvolatile Memory Element

FIG. 1 is a cross-sectional view showing a configuration of a nonvolatile memory element according to Embodiment 1.

As shown in FIG. 1, a nonvolatile memory element 10 according to Embodiment 1 includes: a substrate 1; a first electrode 2 formed on the substrate 1; a variable resistance layer 3 formed on the first electrode 2; and a second electrode 4 formed on the variable resistance layer 3. The first electrode 2 and the second electrode 4 are electrically connected to the variable resistance layer 3.

The substrate 1 is a silicon substrate, for example. Each of the first electrode 2 and the second electrode 4 comprises a conductive material, such as one or more materials among gold (Au), platinum (Pt), iridium (Ir), copper (Cu), titanium nitride (TiN), and tantalum nitride (TaN).

The variable resistance layer 3 comprises a transition metal oxide, and includes: a first oxide region 3a (first metal oxide region) having a low oxygen content atomic percentage; and a second oxide region 3b (second metal oxide region) having a high oxygen content atomic percentage. The variable resistance layer 3 comprising the transition metal oxide can be formed with a low temperature process compared to a variable resistance layer comprising the PCMO material or the like. In other words, the variable resistance layer 3 can be easily formed using an existing CMOS process.

The transition metal oxide is, for example, a tantalum oxide. The following describes an example in which the variable resistance layer 3 comprises a tantalum oxide, and the first oxide region 3a is denoted as a first tantalum oxide layer 3a, and the second oxide region is denoted as a second tantalum oxide layer 3b. More specifically, the variable resistance layer 3 includes the first tantalum oxide layer 3a and the second tantalum oxide layer 3b stacked therein. Here, the oxygen content atomic percentage of the second tantalum oxide layer 3b is higher than the oxygen content atomic percentage of the first tantalum oxide layer 3a.

Note that, the "oxygen content atomic percentage" is a ratio of oxygen atoms to the total number of atoms. For example, the oxygen content atomic percentage of $Ta_2O_5$ is a ratio of oxygen atoms to the total number of atoms (O/(Ta+O)) and is thus 71.4 atm %. This means that an oxygen-deficient tantalum oxide has an oxygen content atomic percentage higher than 0 and lower than 71.4 atm %.

Figure 2:
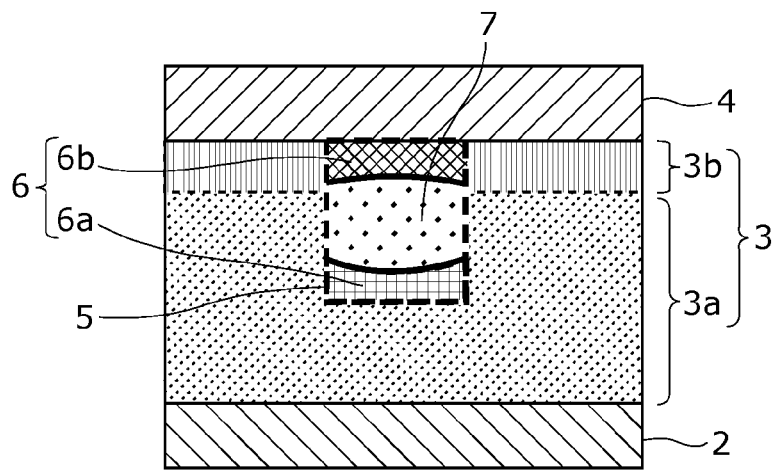
FIG. 2 is a diagram showing a configuration of a local region formed in the nonvolatile memory element according to Embodiment 1.

Furthermore, as shown in FIG. 2, the variable resistance layer 3 includes a local region 5 which is in contact with the second electrode and not in contact with the first electrode. The local region 5 includes a high oxygen concentration region 6 (a first high oxygen concentration region 6a, and a second high oxygen concentration region 6b) which is positioned above and below a low oxygen concentration region 7. A conductive filament is formed in the high oxygen concentration region 6.

Furthermore, in Embodiment 1, x is in a range from 0.8 to 1.9, both inclusive, and y is in a range from 2.1 to 2.5, both inclusive, when a composition of the first tantalum oxide layer 3a is represented as $TaO_x$, and the composition of the second tantalum oxide layer 3b is represented as $TaO_y$. Use of the tantalum oxide having a composition in the above range for each of the first tantalum oxide layer 3a and the second tantalum oxide layer 3b makes it possible to change the resistance value of the variable resistance layer 3 stably at high speed.

Change in the resistance value is recognizable when the thickness of the variable resistance layer 3 is 1 μm or less. However, in view of processing, the thickness of the variable resistance layer 3 is 200 nm or less in Embodiment 1. The reason for this is that fabrication in etching process at the time of patterning is easy. Furthermore, the variable resistance layer 3 having such a thickness makes it possible to reduce a voltage value of a voltage pulse necessary for changing the resistance value of the variable resistance layer 3. Furthermore, in order to make sure to avoid a breakdown (insulation breakdown) in application of voltage pulses, the thickness of the variable resistance layer 3 may be at least 5 nm or more.

Furthermore, the thickness of the second tantalum oxide layer 3b may be 8 nm or less in order to design the second tantalum oxide layer 3b in which the initial resistance value is not too high. Conversely, the thickness of the second tantalum oxide layer 3b may be 1 nm or more in order to trigger stable resistance-changing-phenomenon.

Furthermore, in order to facilitate the occurrence of oxidation-reduction reaction (a resistance change) in the vicinity of the second electrode 4, the above-described material and the above-described metal may be selected so that the standard electrode potential of a material comprised in the second electrode 4, which is connected to the second oxide region 3b having a high oxygen content atomic percentage, is higher than the standard electrode potential of a metal comprised in the variable resistance layer 3. Furthermore, from the same perspective, the above-described material may be selected so that the standard electrode potential of a material comprised in the first electrode 2, which is connected to the first oxide region 3a having a low oxygen content atomic percentage, is lower than the standard electrode potential of a material comprised in the second electrode 4. For example, when the metal comprised in the variable resistance layer 3 is tantalum, the material comprised in the second electrode 4 may be gold (Au), platinum (Pt), iridium (Ir), copper (Cu), or the like, and the material comprised in the first electrode 2 may be titanium nitride (TiN), or tantalum nitride (TaN).

When the nonvolatile memory element 10 configured as above is operated, a voltage pulse (electric pulse) having a predetermined polarity, a voltage, and time duration is applied between the first electrode 2 and the second electrode 4 (between the electrodes). In the nonvolatile memory element 10, as described later, state of the conductive filament in the variable resistance layer 3 changes according to an application of a voltage pulse, which enables the variable resistance layer 3 to change to four states each having a different resistance value with high reproducibility. The state at the respective resistance values after the change is kept for a sufficiently long time. Thus, assigning the four states each having a different resistance value to four values enables the nonvolatile memory element 10 to store multiple values.

Note that, in the following embodiments, the voltage value of the voltage pulse applied between the electrodes indicates the potential of the second electrode 4 with respect to the potential of the first electrode 2.

[Method of Manufacturing Nonvolatile Memory Element]

Next, an example of a method of manufacturing the nonvolatile memory element 10 according to Embodiment 1 is described. It should be noted that configuration, material, manufacturing technique, manufacturing conditions, and the like of the nonvolatile memory element 10 are not limited to those described below.

First, the first electrode 2 (TaN) having a thickness of, for example, 50 nm is formed on the substrate 1 using a sputtering method. Then, a tantalum oxide layer is formed on the first electrode 2 using what is called a reactive sputtering method in which a Ta target is sputtered in argon gas and oxygen gas. Here, the oxygen content atomic percentage in the tantalum oxide layer can be adjusted easily by changing the flow ratio of the oxygen gas to the argon gas. It is to be noted that the substrate need not be specially heated and the temperature of the substrate may be, for example, at room temperature. The formed tantalum oxide layer is amorphous.

Next, the uppermost surface of the tantalum oxide layer formed as described above is modified by oxidation. Thus, a region (second region) having a higher oxygen content atomic percentage than a region (first region) not oxidized in the tantalum oxide layer is formed on the surface of the tantalum oxide layer. The first region and the second region correspond to the above-described first tantalum oxide layer 3a and the second tantalum oxide layer 3b, respectively. The variable resistance layer 3 including the first tantalum oxide layer 3a and the second tantalum oxide layer 3b is thus formed.

Note that, the first tantalum oxide layer 3a and the second tantalum oxide layer 3b are formed so as to satisfy, for example, x=1.57 and y=2.47, when the composition of the first tantalum oxide layer 3a is represented by $TaO_x$ and the composition of the second tantalum oxide layer 3b is represented by TaO$_y$. Furthermore, the layers are formed so that, for example, the thickness of the variable resistance layer 3 is 50 nm, the thickness of the first tantalum oxide layer 3a is 44 nm, and the thickness of the second tantalum oxide layer 3b is 6 nm.

Next, on the variable resistance layer 3 formed as described above, the second electrode 4 (Ir) having a thickness of, for example, 50 nm is formed using a sputtering method. The nonvolatile memory element 10 is thus obtained.

Note that, the size and the shape of each of the first electrode 2, the second electrode 4, and the variable resistance layer 3 can be adjusted by a mask and a photolithography process. For example, each of the second electrode 4 and the variable resistance layer 3 has dimensions of 0.5 μm×0.5 μm (area of 0.25 μm$^2$), and a portion where the first electrode 2 and the variable resistance layer 3 contact with each other has dimensions of 0.5 μm×0.5 μm (area of 0.25 μm$^2$).

[Formation of Conductive Filament]

A predetermined voltage pulse for the initial breakdown is applied between the first electrode 2 and the second electrode 4 (between the electrodes) of the nonvolatile memory element 10 having the above-described configuration, which forms at least one conductive filament in the variable resistance layer 3. Initial breakdown is a process for changing the state of the nonvolatile memory element 10 from the significantly high resistance state immediately after the manufacturing, in which resistance change does not occur, to a resistance state in which resistance change can occur. The predetermined voltage pulse for the initial breakdown is a voltage pulse having a higher absolute value than the voltage which is necessary for the normal resistance change. Furthermore, the conductive filament means a conductive path which serves as a current path for a cell current.

A local region including the conductive filament is formed in the nonvolatile memory element 10 on which the initial breakdown has been performed.

FIG. 2 is a diagram showing a configuration of the local region including the conductive filament formed in the nonvolatile memory element 10 according to Embodiment 1.

As shown in FIG. 2, the local region 5 is formed in the variable resistance layer 3. The top of the local region 5 is on a side of the second electrode 4 and extends toward the first electrode 2. In FIG. 2, the local region 5 includes the high oxygen concentration region 6 and the low oxygen concentration region 7.

The high oxygen concentration region 6 is a region having a high oxygen content atomic percentage compared to the low oxygen concentration region 7, and includes the first high oxygen concentration region 6a and the second high oxygen concentration region 6b. Furthermore, in Embodiment 1, the first high oxygen concentration region 6a is configured so as to have a high oxygen content atomic percentage compared to the first tantalum oxide layer 3a, and the second high oxygen concentration region 6b is configured so as to have a low oxygen content atomic percentage compared to the second tantalum oxide layer 3b. It should be noted that the high oxygen concentration region 6 and the low oxygen concentration region 7 are formed in the variable resistance layer 3 by (i) the initial breakdown described above and (ii) the voltage pulse application after the initial breakdown, which is described later and is for forming a high oxygen concentration region.

In the example shown in FIG. 2, the local region 5 includes: the first high oxygen concentration region 6a positioned at lower end part of the local region 5; the second high oxygen concentration region 6b positioned at upper end part of the local region 5; and the low oxygen concentration region 7 positioned between the region 6a and the region 6b. The local region 5 is formed to extend across the first tantalum oxide layer 3a and the second tantalum oxide layer 3b. The local region 5 is in contact with the second electrode 4 but not in contact with the first electrode 2.

The first high oxygen concentration region 6a is formed in the first tantalum oxide layer 3a, and the second high oxygen concentration region 6b is formed in the second tantalum oxide layer 3b. Furthermore, the region including the low oxygen concentration region 7 is formed to extend across the first tantalum oxide layer 3a and the second tantalum oxide layer 3b.

The high oxygen concentration region 6 (the first high oxygen concentration region 6a, and the second high oxygen concentration region 6b) includes a collection of conductive paths (conductive filaments). It can be inferred that, typically, an oxygen atom in the high oxygen concentration region 6 moves due to the voltage applied to the nonvolatile memory element 10, and the conductive path is formed by a series of oxygen defects.

Note that, although the above describes the configuration in which the local region 5 is formed to extend across the first tantalum oxide layer 3a and the second tantalum oxide layer 3b, the configuration in which the local region 5 is formed only in the second tantalum oxide layer 3b is also acceptable.

The existence of the above-described local region 5 can be confirmed by observing the cross-section of the element with a transmission electron microscope (TEM). Furthermore, the observation of the cross-section of the element with the TEM also allows to confirm that the lower end part and the upper end part of the local region is configured of the first high oxygen concentration region 6a and the second high oxygen concentration region 6b, respectively, and the region between the region 6a and the region 6b is configured of the low oxygen concentration region 7.

[Characteristics of Nonvolatile Memory Element]

Next, characteristics of the nonvolatile memory element 10 according to Embodiment 1 having the above-described configuration are described with reference to an implementation example and a reference example.

Figure 3:
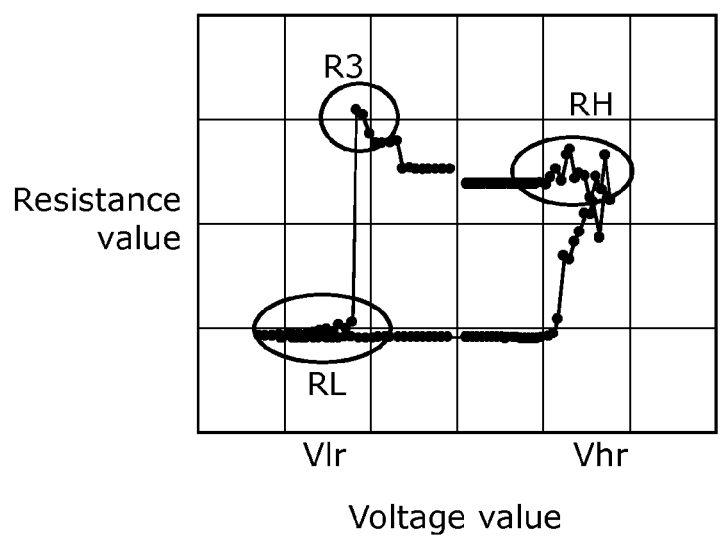
FIG. 3 is a graph showing a relationship between a voltage value of an applied voltage pulse and a resistance value of a variable resistance layer in a nonvolatile memory element in which a second high oxygen concentration region is not formed.

FIG. 3 is a graph showing a relationship between a voltage value of an applied voltage pulse and a resistance value of a variable resistance layer in an example of a nonvolatile memory element which has a similar configuration as the nonvolatile memory element 10 shown in FIG. 1 and in which the second high oxygen concentration region 6b is not formed in the local region 5 shown in FIG. 2 (hereafter referred to as the "reference example").

In the case of the reference example, the predetermined voltage pulse is applied between the first electrode 2 and the second electrode 4 of the nonvolatile memory element which has been manufactured according to the method of manufacturing described above, and thus the initial breakdown is performed.

As a result, in the local region 5 in the variable resistance layer 3 of the reference example, different from the local region 5 shown in FIG. 2, the second high oxygen concentration region 6b is not formed in the local region 5.

After this, in the nonvolatile memory element on which the initial breakdown has been performed as described above, the variable resistance layer 3 is changed to a low resistance state by applying a negative voltage pulse Vlr, and to a high resistance state by applying a positive voltage pulse Vhr to the second electrode 4 with respect to the first electrode 2.

Figure 4:
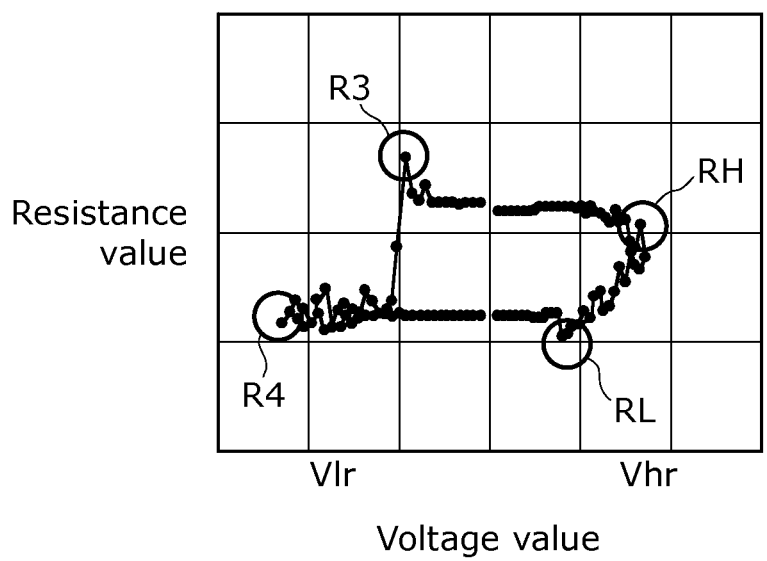
FIG. 4 is a graph showing a relationship between a voltage value of an applied voltage pulse and a resistance value of a variable resistance layer in the nonvolatile memory element according to Embodiment 1.

On the other hand, FIG. 4 is a graph showing a relationship between a voltage of an applied voltage pulse and a resistance value of a variable resistance layer in an example of the nonvolatile memory element 10 which has a similar configuration as the nonvolatile memory element 10 shown in FIG. 1 and in which the local region 5 shown in FIG. 2 is formed (hereafter referred to as the "implementation example"). Specifically, different from the reference example, the nonvolatile memory element 10 according to the implementation example includes the second high oxygen concentration region 6b above the low oxygen concentration region 7.

In the case of the implementation example, after manufacturing the nonvolatile memory element 10 according to the method of manufacturing described above, the predetermined voltage pulse is applied between the first electrode 2 and the second electrode 4 of the nonvolatile memory element 10, and thus the initial breakdown is performed.

After this, in the implementation example, different from the reference example, a plurality of high oxygen concentration region formation voltage pulses are further applied to the nonvolatile memory element 10 on which the initial breakdown has been performed. Each of the high oxygen concentration region formation voltage pulses includes: a voltage pulse having a first polarity; and a voltage pulse having a second polarity different from the first polarity. With this, the local region 5 which includes the second high oxygen concentration region 6b is formed above the low oxygen concentration region 7 in the variable resistance layer 3.

It should be noted that the absolute value of the voltage of the high oxygen concentration region formation voltage pulse is greater than the absolute value of the voltage of the voltage pulse used for the normal resistance change operation and smaller than the absolute value of the voltage of the initial breakdown (initial breakdown voltage). Furthermore, the high oxygen concentration region formation voltage pulse is applied to the nonvolatile memory element 10 for a plurality of times until the resistance state in which the resistance value is R4, which will be described later, occurs.

Comparing FIG. 3 and FIG. 4, while the resistance value of the variable resistance layer 3 in the reference example (FIG. 3) is almost constant (the same) in a low resistance state (RL), the resistance value of the variable resistance layer 3 can take two values (RL and R4) in the low resistance state in the implementation example (FIG. 4).

The occurrence of resistance state in which the resistance value is R4 that is mentioned in the implementation example is attributed to the second high oxygen concentration region 6b positioned at the lower end of the local region 5 formed using the high oxygen concentration region formation voltage pulses. Furthermore, in the high resistance state having a high resistance value, the resistance value of the variable resistance layer 3 in each of the reference example and the implementation example can take two values (RH and R3).

In Embodiment 1, multi-value memory is realized utilizing the characteristic that the nonvolatile memory element takes two different resistance values in each of the low resistance state and the high resistance state. Specifically, in the nonvolatile memory element 10 having a characteristic shown in FIG. 4, multi-value memory of four values is realized with the resistance values RL and R4 in the low resistance state and the resistance values RH and R3 in the high resistance state.

Figure 5:
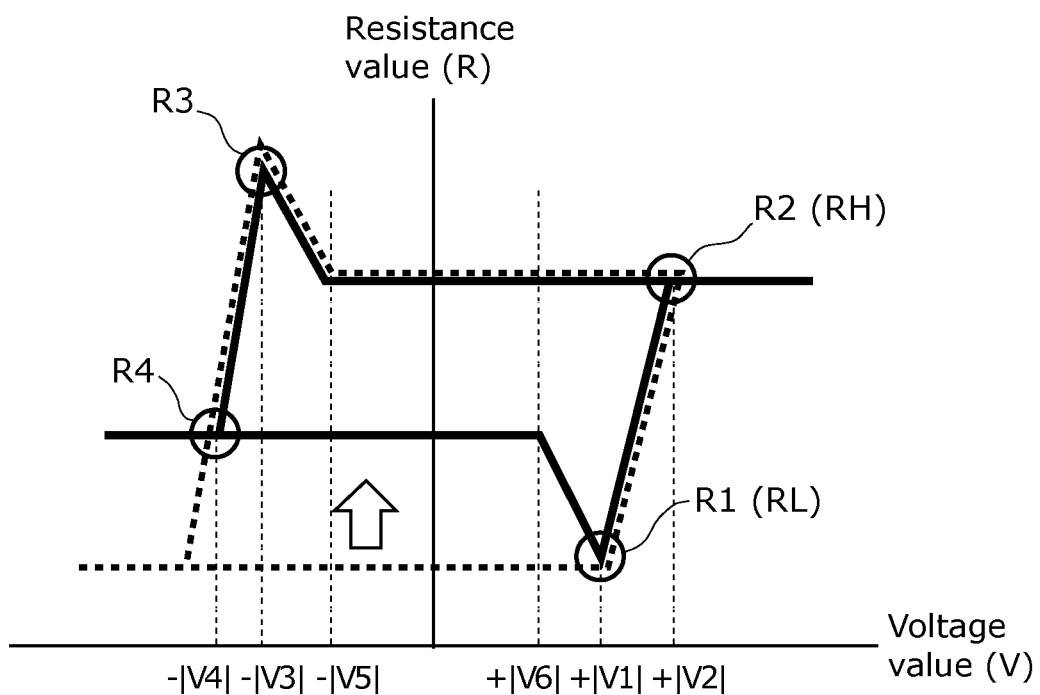
FIG. 5 is a diagram schematically showing resistance-voltage characteristics of the nonvolatile memory element according to Embodiment 1 and a nonvolatile memory element of a reference example.

FIG. 5 is a diagram schematically showing a resistance-voltage characteristic (R-V characteristic) of each of the nonvolatile memory element 10 according to Embodiment 1 and the nonvolatile memory element according to the reference example.

In FIG. 5, the solid line indicates the resistance-voltage characteristic of the nonvolatile memory element 10 according to Embodiment 1 and the broken line indicates the resistance-voltage characteristic of the nonvolatile memory element according to the reference example. Comparing the solid line and the broken line, as described above, a difference lies in that the nonvolatile memory element 10 takes, in the low resistance state, two resistance values that are R1 (RL) and R4.

Note that, in FIG. 5, each of V1, V2, V3, V4, V5, and V6 denotes the voltage value of the voltage pulse applied between the first electrode 2 and the second electrode 4 of the nonvolatile memory element 10. Here, the voltage values V1, V2, and V6 are positive voltages and have a relationship of V2>V1>V6, and the voltage values V3, V4 and V5 are negative voltages and have a relationship of V5>V3>V4. More specifically, V1, V2, V3, V4, V5, and V6 have a relationship of V2>V1>V6>0 V>V5>V3>V4.

Note that, in FIG. 5 and in the following description, voltage values are expressed as +|V1|, +|V2|, −|V3|, −|V4|, −|V5|, and +|V6| using signs and the absolute values of the voltages so that it is clear whether the voltage is positive or negative. Specifically, V1=+|V1|, V2=+|V2|, V3=−|V3|, V4=−|V4|, V5=−|V5|, and V6=+|V6|.

The following describes the resistance-voltage characteristic of the nonvolatile memory element 10 in detail.

Figure 6:
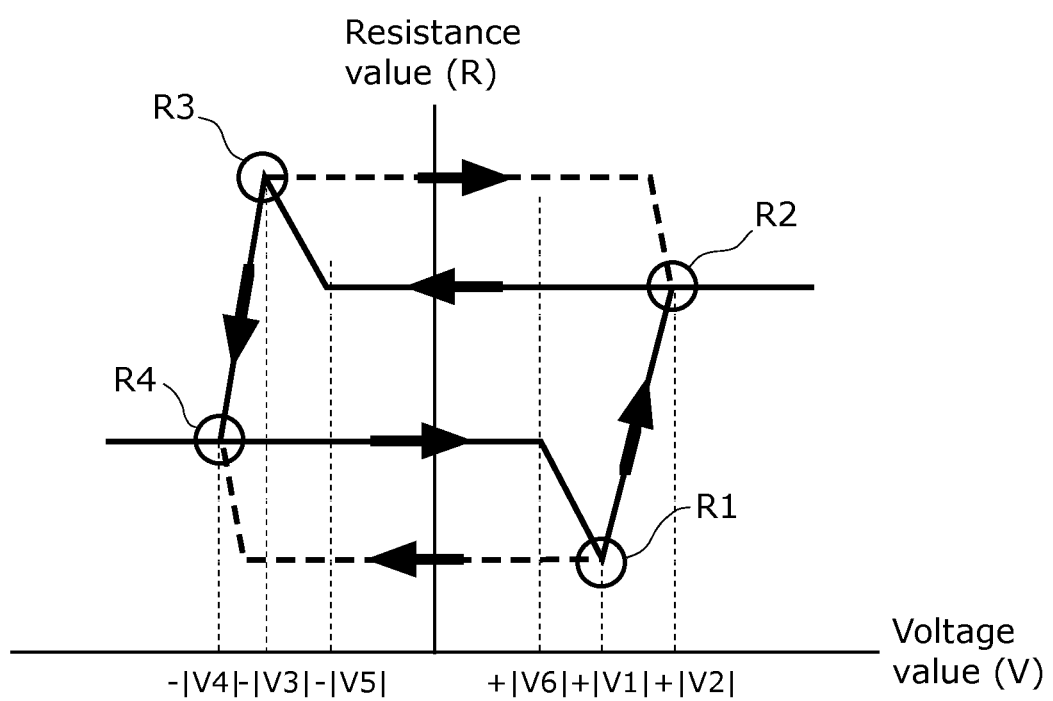
FIG. 6 is a diagram schematically showing resistance-voltage characteristics of the nonvolatile memory element according to Embodiment 1.
Figure 7A:
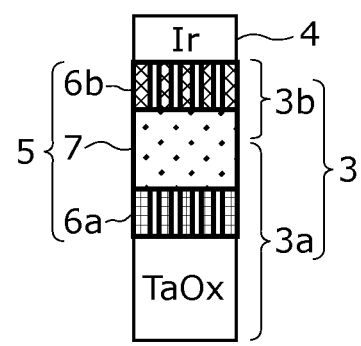
FIG. 7A is a diagram schematically showing the internal state of the variable resistance layer of the nonvolatile memory element, when the resistance value is R1.
Figure 7B:
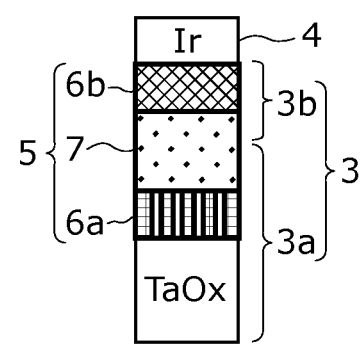
FIG. 7B is a diagram schematically showing the internal state of the variable resistance layer of the nonvolatile memory element, when the resistance value is R2.
Figure 7C:
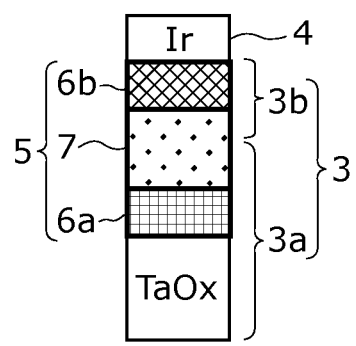
FIG. 7C is a diagram schematically showing the internal state of the variable resistance layer of the nonvolatile memory element, when the resistance value is R3.
Figure 7D:
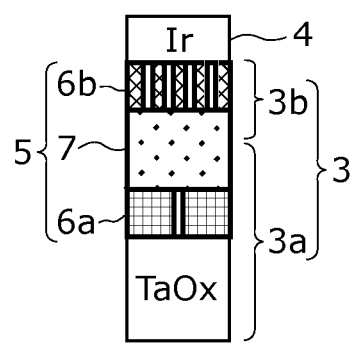
FIG. 7D is a diagram schematically showing the internal state of the variable resistance layer of the nonvolatile memory element, when the resistance value is R4.

FIG. 6 is a diagram schematically showing the resistance-voltage characteristic (R-V characteristic) of the nonvolatile memory element 10 according to Embodiment 1.

Irrespective of the resistance value of the variable resistance layer 3, the resistance value of the variable resistance layer 3 becomes R2, when the voltage pulse having a voltage value of +|V2| or greater is applied between the electrodes. Furthermore, irrespective of the resistance value of the variable resistance layer 3, the resistance value of the variable resistance layer 3 becomes R4, when the voltage pulse having a voltage value of −|V4| or smaller is applied between the electrodes.

Next, the case in which the resistance value of the variable resistance layer 3 is R2 is described. In this case, even when the voltage pulse having a voltage value of −|V5| or greater is applied between the electrodes, the resistance value of the variable resistance layer 3 does not change but remains at R2. In other words, the state in which the resistance value is R2 is a stable state.

However, when the voltage pulse having a voltage value smaller than −|V5| is applied between the electrodes, the resistance value of the variable resistance layer 3 increases to above R2. In addition, when the voltage pulse having a voltage value of −|V3| is applied between the electrodes, the resistance value of the variable resistance layer 3 becomes R3.

Next, the case in which the resistance value of the variable resistance layer 3 is R3 is described. In this case, when the voltage pulse having a voltage value smaller than −|V3| is applied between the electrodes, the resistance value of the variable resistance layer 3 decreases to below R3. In addition, when the voltage pulse having a voltage value of −|V4| or smaller is applied between the electrodes, the resistance value of the variable resistance layer 3 becomes R4.

Furthermore, as indicated by the broken line in FIG. 6, when the resistance value of the variable resistance layer 3 is R3, the resistance value of the variable resistance layer 3 remains at R3 and does not change, even when the voltage pulse having a voltage value of −|V3| or greater is applied between the electrodes, up to a predetermined positive voltage value (a value near |V3|). In other words, the state in which the resistance value is R3 is a stable state.

When the voltage pulse having a voltage value greater than the above-described predetermined positive voltage value is applied between the electrodes, the resistance value of the variable resistance layer 3 decreases to below R3. In addition, when the voltage pulse having a voltage value of +|V2| or greater is applied between the electrodes, the resistance value becomes R2.

Next, the case in which the resistance value of the variable resistance layer 3 is R4 is described. In this case, even when the voltage pulse having a voltage value of +|V6| or smaller is applied between the electrodes, the resistance value of the variable resistance layer 3 remains at R4 and does not change. In other words, the state in which the resistance value is R4 is a stable state.

However, when the voltage pulse having a voltage value greater than +|V6| is applied between the electrodes, the resistance value of the variable resistance layer 3 decreases to below R4. In addition, when the voltage pulse having a voltage value of +|V1| is applied between the electrodes, the resistance value of the variable resistance layer 3 becomes R1.

Next, the case in which the resistance value of the variable resistance layer 3 is R1 is described. In this case, when the voltage pulse having a voltage value greater than +|V1| is applied between the electrodes, the resistance value of the variable resistance layer 3 increases to above R1. In addition, when the voltage pulse having a voltage value of +|V2| or greater is applied between the electrodes, the resistance value of the variable resistance layer 3 becomes R2.

Furthermore, as indicated by the broken line in FIG. 5 FIG. 6, when the resistance value of the variable resistance layer 3 is R1, the resistance value of the variable resistance layer 3 remains at R1 and does not change, even when the voltage pulse having a voltage value of +|V1| or smaller is applied between the electrodes, up to a predetermined negative voltage value (a value near −|V1|). In other words, the state in which the resistance value is R1 is a stable state.

When the voltage pulse having a voltage value smaller than the above-described predetermined negative voltage value is applied between the electrodes, the resistance value of the variable resistance layer 3 increases to above R1. In addition, when the voltage pulse having a voltage value of −|V4| or smaller is applied between the electrodes, the resistance value becomes R4.

As described above, the nonvolatile memory element 10 is characterized in that the resistance state of the variable resistance layer 3 changes as shown in FIG. 6.

Subsequently, an internal state of the variable resistance layer 3 of the nonvolatile memory element 10 is described.

FIG. 7A to FIG. 7D are diagrams schematically showing internal states of the variable resistance layer 3 when the resistance values of the variable resistance layer 3 are R1 to R4, respectively. FIG. 7A, FIG. 7B, FIG. 7C, and FIG. 7D show configurations when the resistance value is R1, R2, R3, and R4, respectively.

In FIG. 7A to FIG. 7D, solid-white portions in the first high oxygen concentration region 6a and the second high oxygen concentration region 6b in the local region 5 formed in the variable resistance layer 3 are portions schematically showing the conductive filaments. More specifically, the white portions are portions in which the amount of oxygen atoms is lessen, which is so because the oxygen is transferred due to oxidation-reduction reaction that is caused by the application of the voltage pulse. It should be noted that, as shown in FIG. 7A to FIG. 7D, the second electrode 4 comprises Ir.

As shown in each of FIG. 7A to FIG. 7D, the internal states of the local region 5 in the variable resistance layer 3 are different from one another. According to these internal states, the resistance value of the variable resistance layer 3 takes one of R1 to R4.

It should be noted that, as shown in FIG. 5 or FIG. 6, resistance values R1 to R4 have a relationship of R3>R2>R4>R1, and the resistance values are sufficiently discrete so that it is possible to differentiate them from one another. Thus, assigning different values to the resistance values R1 to R4 enables multi-value memory of four values.

[Writing Method for Use in Nonvolatile Memory Element]

As described above, the nonvolatile memory element 10 according to Embodiment 1 can store four values. Here, based on the above-described resistance-voltage characteristics, the nonvolatile memory element 10 can change to a state in which the resistance value of the variable resistance layer 3 is R2 or R4 with one writing (in other words, with one application of a voltage pulse for writing), from the state having a different resistance value.

However, in order for the nonvolatile memory element 10 to change to the state in which the resistance value of the variable resistance layer 3 is R3, the nonvolatile memory element 10 needs to go through the state in which the resistance value is R2. In a similar manner, in order for the nonvolatile memory element 10 to change to the state in which the resistance value is R1, the nonvolatile memory element 10 needs to go through the state in which the resistance value is R4.

Figure 8:
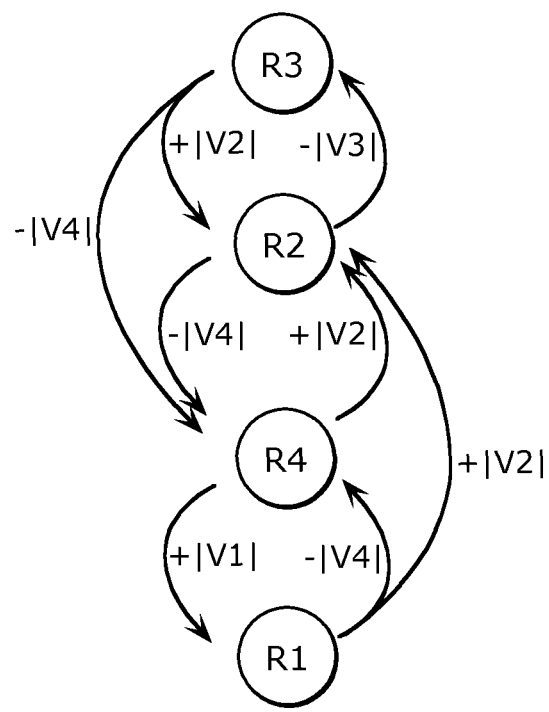
FIG. 8 is a state change diagram of a resistance state of the variable resistance layer in the nonvolatile memory element according to Embodiment 1.

FIG. 8 is a state change diagram of a resistance state of the variable resistance layer 3 in the nonvolatile memory element 10 according to Embodiment 1.

As shown in FIG. 8 and described above, the nonvolatile memory element 10 can change to a state in which the resistance value of the variable resistance layer 3 is R2 or R4 with one writing, from the state having a different resistance value. More specifically, whichever state the resistance value of the variable resistance layer 3 may be in out of R1, R3, and R4, the nonvolatile memory element 10 can be changed to a state in which the resistance value is R2 by applying a voltage pulse having a voltage value of +|V2| between the electrodes. Furthermore, whichever state the resistance value of the variable resistance layer 3 may be in out of R1, R2, and R3, the nonvolatile memory element 10 can be changed to a state in which the resistance value is R4 by applying a voltage pulse having a voltage value of −|V4| between the electrodes.

Figure 9:
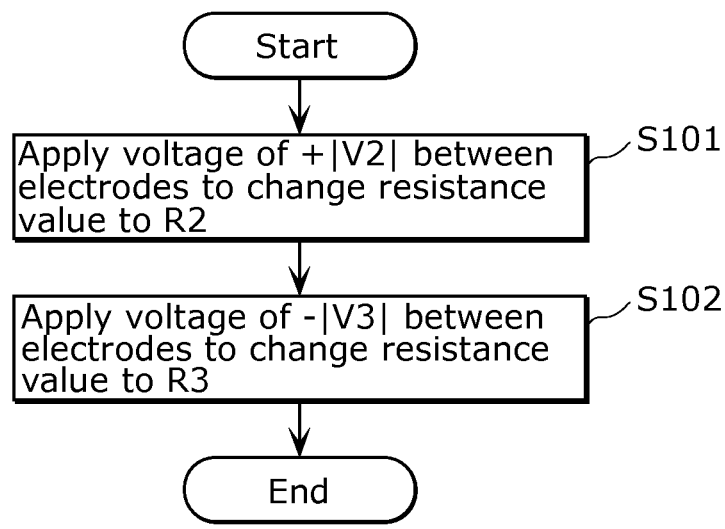
FIG. 9 is a flowchart of a writing method to change the state of the resistance value of a nonvolatile memory element from R1 or R4 to R3.

Furthermore, FIG. 8 shows that, as described above, the nonvolatile memory element 10 cannot change to a state in which the resistance value of the variable resistance layer 3 is R3 unless going through the state in which the resistance value of the variable resistance layer 3 is R2. More specifically, from the state in which the resistance value of the variable resistance layer 3 is R1, the nonvolatile memory element 10 changes to a state in which the resistance value of the variable resistance layer 3 is R3 using the writing method shown in the flowchart in FIG. 9.

First, a voltage pulse having a voltage value of −|V4| and a voltage pulse having a voltage value of +|V2| are applied in this order between the electrodes or a voltage pulse having a voltage value of +|V2| is applied between the electrodes, and thus the nonvolatile memory element 10 is changed to a state in which the resistance value of the variable resistance layer 3 is R2 (S101).

After this, a voltage pulse having a voltage value of −|V3| is applied between the electrodes, and thus the nonvolatile memory element 10 is changed to a state in which the resistance value of the variable resistance layer 3 is R3 (S102).

Note that, the nonvolatile memory element 10 is changed from the state in which the resistance value of the variable resistance layer 3 is R4 to the state in which the resistance value of the variable resistance layer 3 is R3 in a similar manner. First, a voltage pulse having a voltage value of +|V2| is applied between the electrodes, and thus the nonvolatile memory element 10 is changed to a state in which the resistance value of the variable resistance layer 3 is R2. After this, a voltage pulse having a voltage value of −|V3| is applied between the electrodes, and thus the nonvolatile memory element 10 is changed to a state in which the resistance value of the variable resistance layer 3 is R3.

Figure 10:
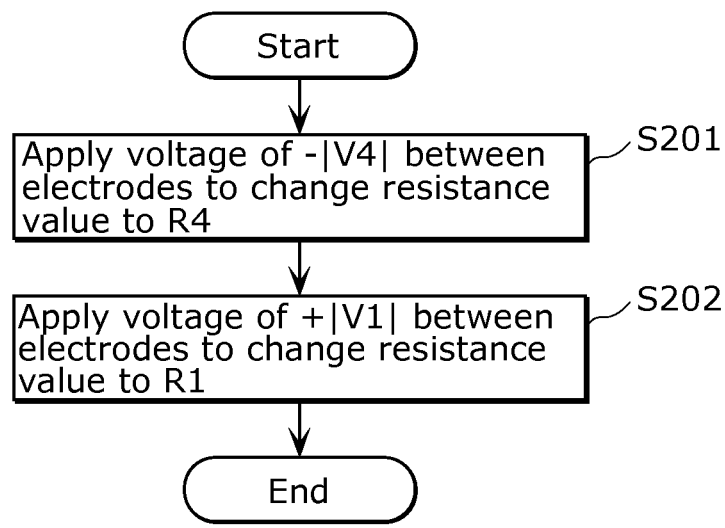
FIG. 10 is a flowchart of a writing method to change the state of the resistance value of the nonvolatile memory element from R2 or R3 to R1.

Furthermore, FIG. 8 shows that, as described above, the nonvolatile memory element 10 cannot change to a state in which the resistance value of the variable resistance layer 3 is R1 unless going through the state in which the resistance value of the variable resistance layer 3 is R4. More specifically, from the state in which the resistance value of the variable resistance layer 3 is R3, the nonvolatile memory element 10 changes to a state in which the resistance value of the variable resistance layer 3 is R1 using the writing method shown in the flowchart in FIG. 10.

First, a voltage pulse having a voltage value of +|V2| and a voltage pulse having a voltage value of −|V4| are applied in this order between the electrodes or a voltage pulse having a voltage value of −|V4| is applied between the electrodes, and thus the nonvolatile memory element 10 is changed to a state in which the resistance value of the variable resistance layer 3 is R4 (S201).

After this, a voltage pulse having a voltage value of +|V1| is applied between the electrodes, and thus the nonvolatile memory element 10 is changed to a state in which the resistance value of the variable resistance layer 3 is R1 (S202).

Note that, the nonvolatile memory element 10 is changed from the state in which the resistance value of the variable resistance layer 3 is R2 to the state in which the resistance value of the variable resistance layer 3 is R1 in a similar manner. First, a voltage pulse having a voltage value of −|V4| is applied between the electrodes, and thus the nonvolatile memory element 10 is changed to a state in which the resistance value of the variable resistance layer 3 is R4. After this, a voltage pulse having a voltage value of +|V1| is applied between the electrodes, and thus the nonvolatile memory element 10 is changed to a state in which the resistance value of the variable resistance layer 3 is R1.

With the writing method described above, the nonvolatile memory element 10 can be changed to a state in which the resistance value of the variable resistance layer 3 is any one of R1 to R4, and thus the multi-value memory of four values is realized.

Embodiment 2

Embodiment 2 describes a configuration and operations of a one-transistor and one-nonvolatile-memory (1T1R) type nonvolatile memory device including the nonvolatile memory element described in Embodiment 1.

[Configuration and Operations of Nonvolatile Memory Device]

Figure 11:
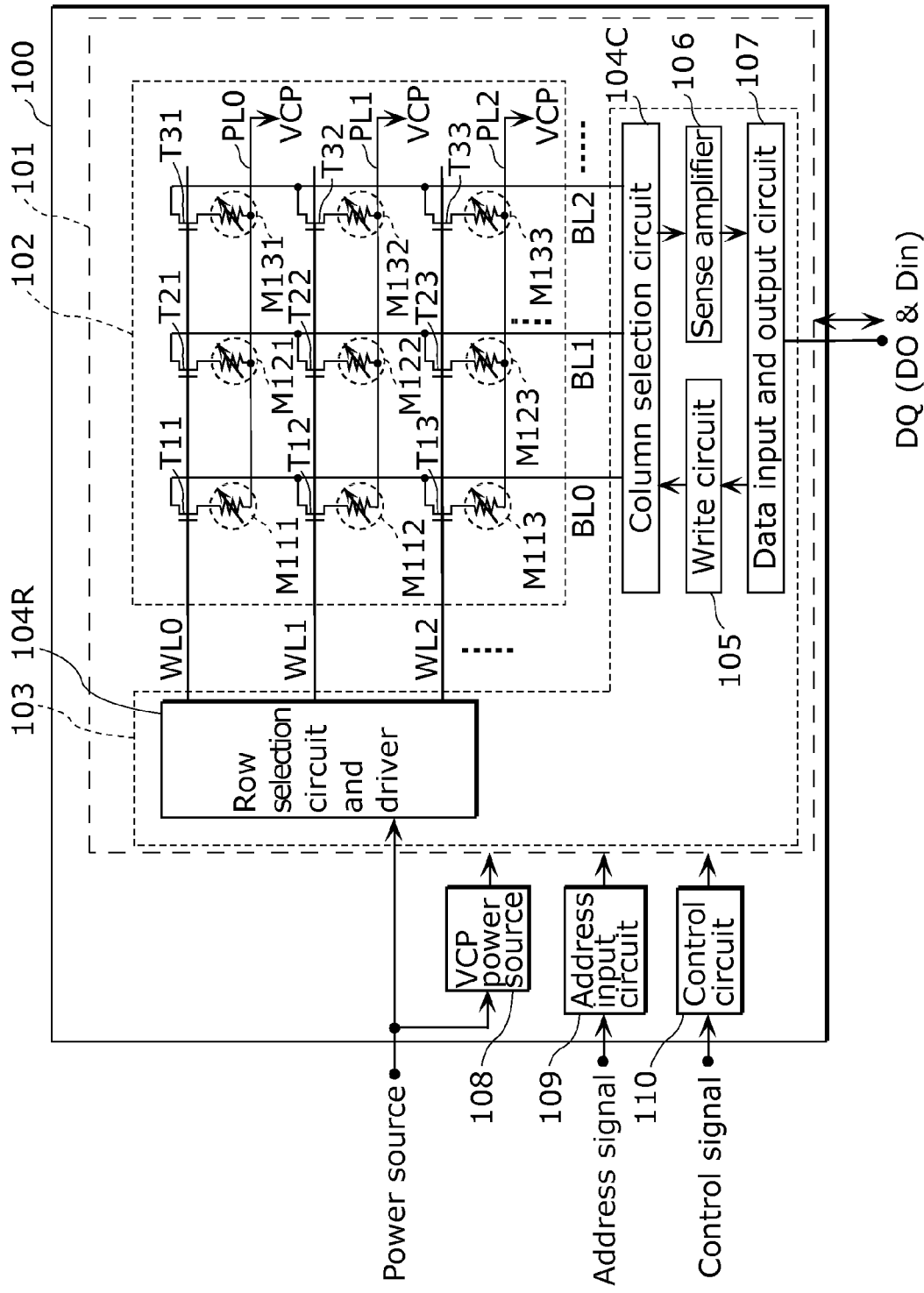
FIG. 11 is a block diagram showing an example of a configuration of a nonvolatile memory device according to Embodiment 2.

FIG. 11 is a block diagram showing an example of a configuration of a nonvolatile memory device according to Embodiment 2.

As shown in FIG. 11, a 1T1R type nonvolatile memory device 100 includes a memory main body 101 above a semiconductor substrate.

The memory main body 101 includes a memory array 102, and a voltage application unit 103.

The voltage application unit 103 includes: a row selection circuit and driver 104R; a column selection circuit 104C; a write circuit 105 for writing data; a sense amplifier 106 which detects an amount of current flowing in a selected bit line, to determine which data is stored out of the four values; and a data input and output circuit 107 which performs input and output processing of input and output data via a DQ terminal.

In addition, the nonvolatile memory device 100 further includes: a cell plate power source (VCP power source) 108; an address input circuit 109 which receives address signals input from the outside; and a control circuit 110 which controls operations of the memory main body 101 based on a control signal input from the outside.

It should be noted that the voltage application unit 103 may be configured of a combination of known circuits other than the combination described above. Furthermore, the voltage application unit 103 may include the cell plate power source 108, the address input circuit 109, and the control circuit 110. In other words, it is sufficient that the voltage application unit 103 be a unit which (i) selects one voltage pulse out of voltage pulses of four or greater values including at least V1 to V4 and applies the selected voltage pulse to the nonvolatile memory element in the write step and (ii) determines, in a read step, which resistance value out of R1 to R4 the each of the nonvolatile memory elements has.

The memory array 102 includes: word lines WL0, WL1, WL2 . . . and bit lines BL0, BL1, BL2 . . . which are formed on the semiconductor substrate and arranged to cross each other; transistors T11, T12, T13, T21, T22, T23, T31, T32, T33 . . . (hereafter referred to as "transistors T11, T12 . . . ") each of which is provided to correspond to a corresponding one of cross-points of the word lines WL0, WL1, WL2 . . . and the bit lines BL0, BL1, BL2 . . . ; and variable resistance elements M111, M112, M113, M121, M122, M123, M131, M132, and M133 (hereafter referred to as "memory cells M111, M112 . . . ") which are provided to correspond to the transistors T11, T12 . . . in a one-to-one relationship. Here, each of the memory cells M111, M112 . . . corresponds to the nonvolatile memory element 10 of Embodiment 1.

In addition, the memory array 102 includes plate lines PL0, PL1, PL2 . . . which are arranged parallel to the word lines WL0, WL1, WL2 . . . .

Drains of the transistors T11, T12, T13 . . . , drains of the transistors T21, T22, T23 . . . , and drains of the transistors T31, T32, T33 . . . are connected to the bit line BL0, the bit line BL1, and the bit line BL2, respectively.

Moreover, gates of the transistors T11, T21, T31 . . . , gates of the transistors T12, T22, T32 . . . , and gates of the transistors T13, T23, T33 . . . are connected to the word line WL0, the word line WL1, and the word line WL2, respectively.

Furthermore, each of sources of the transistors T11, T12 . . . is connected to an end (one of the first electrode 2 and the second electrode 4 of the nonvolatile memory element 10) of a corresponding one of the memory cells M111, M112 . . . .

Moreover, the other end (the other of the first electrode 2 and the second electrode 4 of the nonvolatile memory element 10) of each of the memory cells M111, M121, M131 . . . is connected to the plate line PL0, the other end of each of the memory cells M112, M122, M132 . . . is connected to the plate line PL1, and the other end of each of the memory cells M113, M123, M133 . . . is connected to the plate line PL2.

The address input circuit 109 receives an address signal from an external circuit (not shown), and, based on the address signal, outputs a row address signal to the row selection circuit and driver 104R and outputs a column address signal to the column selection circuit 104C. Here, the address signal is a signal indicating an address of a specific memory cell to be selected from among the plurality of memory cells M111, M112 .... Moreover, the row address signal is a signal indicating an address of a row which is part of the address indicated by the address signal, and the column address is a signal indicating an address of a column which is part of the address indicated by the address signal.

In the data write step, the control circuit 110 outputs, to the write circuit 105, a write command signal instructing application of a voltage for writing, according to input data Din input into the data input and output circuit 107. On the other hand, in the data read step, the control circuit 110 outputs, to the column selection circuit 104C, a read command signal instructing an application of a voltage for reading.

The row selection circuit and driver 104R receives the row address signal output from the address input circuit 109, and selects one of the word lines WL0, WL1, WL2 ... according to the row address signal, and applies a predetermined voltage to the selected word line.

Furthermore, the column selection circuit 104C receives the column address signal output from the address input circuit 109, selects one of the bit lines BL0, BL1, BL2 ... according to the column address signal, and applies the voltage for writing or the voltage for reading to the selected bit line.

When the write circuit 105 receives the write command signal output from the control circuit 110, the write circuit 105 outputs, to the column selection circuit 104C, a signal instructing the application of the voltage for writing to the selected bit line. Here, when writing a value corresponding to resistance value R2, a signal instructing the application of voltage +|V2| for writing is output, and when writing a value corresponding to resistance value R4, a signal instructing the application of voltage −|V4| for writing is output. Furthermore, when writing a value corresponding to resistance value R3, a signal instructing the application of voltage +|V2| for writing and a signal instructing the application of voltage −|V3| for writing are output in this order. Furthermore, when writing a value corresponding to resistance value R1, a signal instructing the application of voltage −|V4| for writing and a signal instructing the application of voltage +|V1| for writing are output in this order.

In the data read step, the sense amplifier 106 detects an amount of current flowing in the selected bit line which is a read target, to determine the stored data. In Embodiment 2, each of the memory cells M111, M112 ... can take four resistance states which correspond to resistance values R1 to R4. These four states and data items for four values are associated. The sense amplifier 106 determines in which state the resistance of the variable resistance layer of the selected memory cell is in out of the four states, to determine which data is stored out of the four values according to the resistance state. An output data DO obtained as a result of the determination is output to the external circuit via the data input and output circuit 107.

The nonvolatile memory device 100 operates as described above, and thus realizes the mufti-value memory of four values.

Embodiment 3

Embodiment 3 describes a cross-point nonvolatile memory device including the nonvolatile memory element described in Embodiment 1. The following describes the configuration and operations of the nonvolatile memory device.

[Configuration and Operations of Nonvolatile Memory Device]

Figure 12:
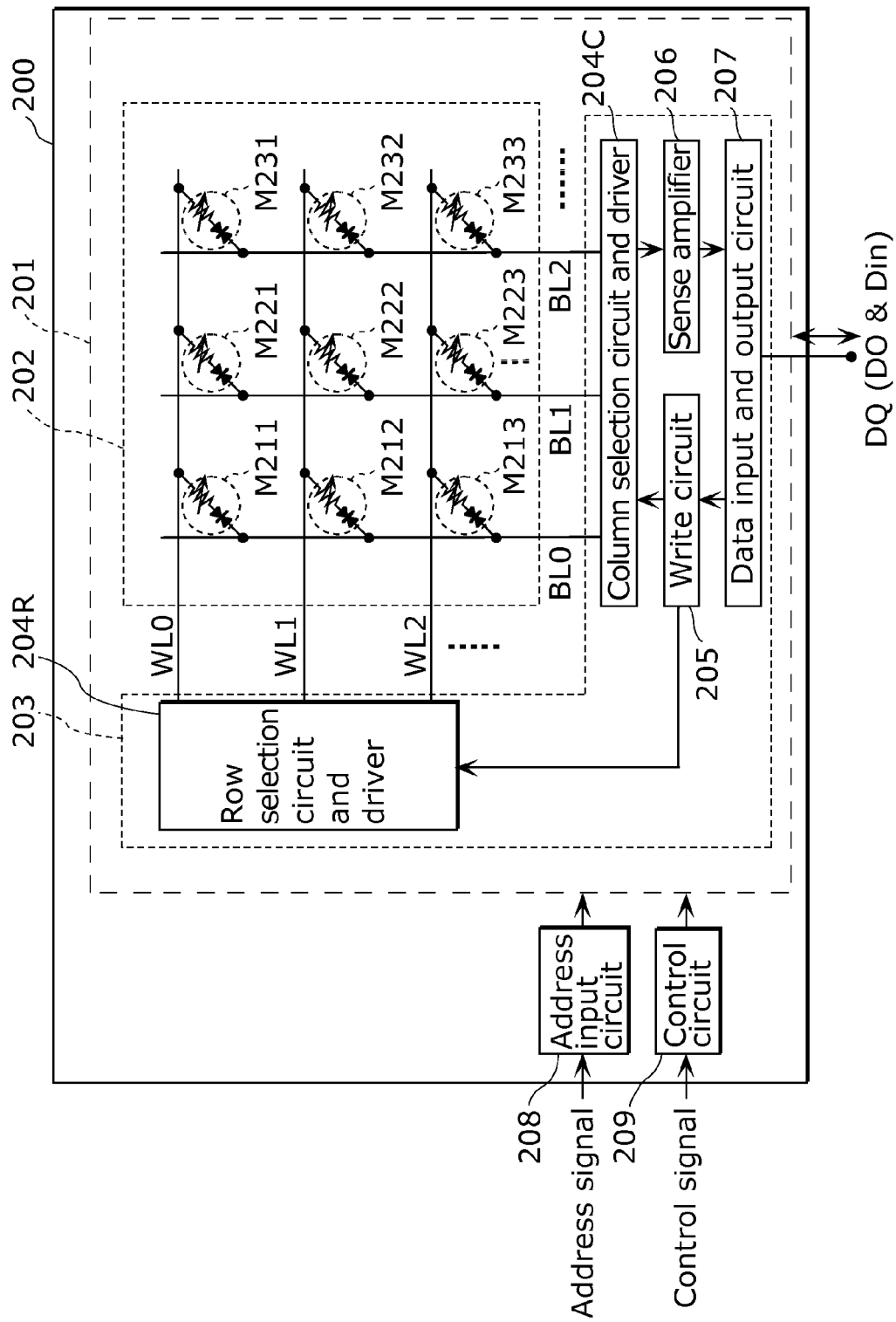
FIG. 12 is a block diagram showing an example of a configuration of a nonvolatile memory device according to Embodiment 3.

FIG. 12 is a block diagram showing an example of a configuration of a nonvolatile memory device according to Embodiment 3.

As shown in FIG. 12, a nonvolatile memory device 200 includes a memory main body 201 above a semiconductor substrate.

The memory main body 201 includes a memory array 202, and a voltage application unit 203.

The voltage application unit 203 includes: a row selection circuit and driver 204R; a column selection circuit and driver 204C; a write circuit 205 for writing data; a sense amplifier 206 which detects an amount of current flowing in a selected bit line, to determine which data is stored out of four values; and a data input and output circuit 207 which performs input and output processing of input and output data via a DQ terminal.

In addition, the nonvolatile memory device 200 further includes: an address input circuit 208 which receives an address signal input from the outside; and a control circuit 209 which controls operations of the memory main body 201 based on a control signal input from the outside.

Note that, the voltage application unit 203 may have any other configuration as long as being a unit which (i) selects one voltage pulse out of voltage pulses of four or greater values including at least V1 to V4 and applies the selected voltage pulse to the nonvolatile memory element in a write step and (ii) determines, in a read step, which resistance value out of R1 to R4 the each of the nonvolatile memory elements has.

As shown in FIG. 12, the memory array 202 includes: word lines WL0, WL1, WL2 ... which are formed parallel to each other on the semiconductor substrate; and bit lines BL0, BL1, BL2 ... which are formed above the word lines WL0, WL1, WL2 ... so as to be parallel to each other on a plane that is parallel to a principal plane of the semiconductor substrate and to three-dimensionally cross the word lines WL0, WL1, WL2 ....

Moreover, a plurality of memory cells M211, M212, M213, M221, M222, M223, M231, M232, M233 ... (hereafter referred to as "memory cells M211, M212 ... ") are arranged in a matrix corresponding to respective cross-points of the word lines WL0, WL1, WL2 ... and bit lines BL0, BL1, BL2 .... Here, each of the memory cells M211, M212 ... is configured by connecting the element which corresponds to the nonvolatile memory element 10 of Embodiment 1 in series to a current steering element including a metal-insulator-metal (MIM) diode, a metal-semiconductor-metal (MSM) diode, or the like.

The address input circuit 208 receives an address signal from an external circuit (not shown), and, based on the address signal, outputs a row address signal to the row selection circuit and driver 204R and outputs a column address signal to the column selection circuit and driver 204C. Here, the address signal is a signal indicating an address of a specific memory cell to be selected from among the plurality of memory cells M211, M212 .... Moreover, the row address signal is a signal indicating an address of a row which is part of the address indicated by the address signal, and the column address signal is a signal indicating an address of a column which is part of the address indicated by the address signal.

In the data write step, the control circuit 209 outputs, to the write circuit 205, a write command signal instructing application of a voltage for writing, according to input data Din input into the data input and output circuit 207. On the other hand, in the data read step, the control circuit 209 outputs, to the column selection circuit and driver 204C, a read command signal instructing a read operation.

The row selection circuit and driver 204R receives the row address signal output from the address input circuit 208, and selects one of the word lines WL0, WL1, WL2 . . . according to the row address signal, and applies a predetermined voltage to the selected word line.

Furthermore, the column selection circuit and driver 204C receives the column address signal output from the address input circuit 208, selects one of the bit lines BL0, BL1, BL2 . . . according to the column address signal, and applies a voltage for writing or a voltage for reading to the selected bit line.

When the write circuit 205 receives the write command signal output from the control circuit 209, the write circuit 205 (i) outputs, to the row selection circuit and driver 204R, a signal instructing the application of the voltage to the selected word line, and (ii) outputs, to the column selection circuit and driver 204C, a signal instructing the application of the voltage for writing to the selected bit line. Here, when writing a value corresponding to resistance value R2, the write circuit 205 outputs a signal instructing the application of voltage +|V2| for writing. When writing a value corresponding to resistance value R4, the write circuit 205 outputs a signal instructing the application of voltage −|V4| for writing. Furthermore, when writing a value corresponding to resistance value R3, the write circuit 205 outputs a signal instructing the application of voltage +|V2| for writing and a signal instructing the application of voltage −|V3| for writing in this order. Furthermore, when writing a value corresponding to resistance value R1, the write circuit 205 outputs a signal instructing the application of voltage −|V4| for writing and a signal instructing the application of voltage +|V1| for writing in this order.

In the data read step, the sense amplifier 206 detects an amount of current flowing in the selected bit line which is a read target, to determine the stored data. In Embodiment 3, each of the memory cells M211, M212 . . . can take four resistance states which correspond to resistance values R1 to R4. These four states and data items for four values are associated. The sense amplifier 206 determines in which state the resistance of the variable resistance layer of the selected memory cell is in out of the four states, to determine which data is stored out of the four values according to the resistance state. An output data DO obtained as a result of the determination is output to the external circuit via the data input and output circuit 207.

The nonvolatile memory device 200 operates as described above, and thus realizes the multi-value memory of four values.

Note that, it is also possible to realize a multi-stacked nonvolatile memory device by three-dimensionally stacking memory arrays each of which is the memory array included in the nonvolatile memory device according to Embodiment 3 shown in FIG. 12. With the multi-stacked memory array thus formed, it is possible to realize an ultrahigh capacity nonvolatile memory device.

Other Embodiments

In each of the above embodiments, the variable resistance layer has a stacked structure of tantalum oxides. However, a metal comprised in the variable resistance layer 3 may be a metal other than tantalum. As the metal comprised in the variable resistance layer 3, a transition metal or aluminum (Al) may be used. Examples of usable transition metals include: tantalum (Ta), titanium (Ti), hafnium (Hf), zirconium (Zr), niobium (Nb), tungsten (W), and nickel (Ni). Since the transition metal can take a plurality of oxidation states, it is possible to provide different resistance states by an oxidation-reduction reaction.

For example, when a hafnium oxide is used, the resistance value of the variable resistance layer 3 can be stably changed at high speed when the first oxide region 3a has a composition of $HfO_x$ and the second oxide region 3b has a composition of $HfO_y$ where x is 0.9 or more and 1.6 or less and y is larger than x in value. In this case, the thickness of the second oxide region 3b may be 3 to 4 nm.

Furthermore, when a zirconium oxide is used, the resistance value of the variable resistance layer 3 can be stably changed at high speed when the first oxide region 3a has a composition of $ZrO_x$ and the second oxide region 3b has a composition of $ZrO_y$ where x is 0.9 or more and 1.4 or less and y is larger than x in value. In this case, the thickness of the second oxide region 3b may be 1 to 5 nm.

In each of the above-described embodiments, different metals may be used for the first metal comprised in the first oxide region 3a and the second metal comprised in the second oxide region 3b. In this case, the second oxide region 3b may have a lower degree of oxygen deficiency, namely, have higher resistance than the first oxide region 3a. With such a configuration, a voltage applied between the first electrode 2 and the second electrode 4 at the time of a resistance change is distributed more to the second oxide region 3b, so that it is possible to facilitate the oxidation-reduction reaction which occurs in the second oxide region 3b.

Furthermore, when the materials used for the first metal comprised in the first oxide region 3a, which becomes the first variable resistance layer, and the second metal comprised in the second oxide region 3b, which becomes the second variable resistance layer, are different from each other, the second metal may have a standard electrode potential lower than the standard electrode potential of the first metal. The higher the standard electrode potential of a material is, the more difficult it is to oxidize the material. With this, oxidation-reduction occurs more easily in the second oxide region 3b having a relatively low standard electrode potential. Note that, it is believed that the resistance change phenomenon is a change in resistance value (oxygen deficient degree) of the variable resistance layer 3 attributed to the change in filament (conductive path) due to an oxidation-reduction reaction that is assumed to occur in a minute local region formed in the second oxide region 3b having a high resistance.

For example, stable resistance change operation is achieved when an oxygen-deficient tantalum oxide ($TaO_x$) is used for the first oxide region 3a, and a titanium oxide ($TiO_2$) is used for the second oxide region 3b. Titanium (standard electrode potential=−1.63 eV) is a material having a lower standard electrode potential than tantalum (standard electrode potential=−0.6 eV). As described, by using, for the second oxide region 3b, an oxide of a metal having a lower standard electrode potential than the first oxide region 3a, the oxidation-reduction occurs more easily in the second oxide region 3b. As other combinations, an aluminum oxide ($Al_2O_3$) can be used for the second oxide region 3b which can be a high resistance layer. For example, an oxygen-deficient tantalum oxide ($TaO_x$) may be used for the first oxide region 3a, and an aluminum oxide ($Al_2O_3$) may be used for the second oxide region 3b.

Furthermore, a dielectric constant of the second oxide region 3b may be larger than a dielectric constant of the first oxide region 3a. Alternatively, a band gap of the second oxide region 3b may be smaller than a band gap of the first oxide region 3a. For example, $TiO_2$ (relative dielectric constant=95) is a material having a larger relative dielectric constant than Ta$_2$O$_5$ (relative dielectric constant=26). In addition, TiO$_2$ (band gap=3.1 eV) is a material having a smaller band gap than Ta$_2$O$_5$ (band gap=4.4 eV). Typically, a breakdown occurs more easily in a material having a large relative dielectric constant compared to a material having a small relative dielectric constant. Furthermore, a breakdown occurs more easily in a material having a small band gap compared to a material having a large band gap. Thus, the initial breakdown voltage can be lowered by using TiO$_2$ as the second oxide region 3b.

When a transition metal oxide satisfying one or both of the above-described conditions is used for the second oxide region 3b, the breakdown strength of the second oxide region 3b is smaller than the breakdown strength of the first oxide region 3a, and thus the initial breakdown voltage can be lowered. This is because, as shown in FIG. 1 in J. McPherson et al., IEDM 2002, pp. 633-636 of NPL 4, there is a correlation between the breakdown strength and dielectric constant of the oxide layer, and the larger the dielectric constant is, the smaller the breakdown strength becomes. Furthermore, as shown in FIG. 2 in J. McPherson et al., IEDM 2002, pp. 633-636, there is a correlation between the breakdown strength and the band gap of the oxide layer, and the larger the band gap is, the larger the breakdown strength becomes.

It should be noted that, even when the second oxide region 3b in each of the above-described embodiments is a tantalum oxide layer, various transition metal oxides can be used for the first oxide region 3a because the first oxide region 3a is a supplementary layer which performs transfer of oxygen on the conductive filament in the local region 5.

Furthermore, the variable resistance layer 3 may not necessarily have a stacked structure of metal oxides but may have a single layer of metal oxide (the first oxide region 3a), when deposited. After a manufacturing of the nonvolatile memory element 10, in the case of the variable resistance layer 3 including the single layer of metal oxide, a predetermined voltage pulse for forming a high resistance layer is applied between the first electrode 2 and the second electrode 4 of the nonvolatile memory element 10 at least once in a direction to increase the resistance of the nonvolatile memory element 10. A high resistance layer (the second oxide region 3b) is thus formed. After this, by performing processes similar to the processes described in Embodiment 1, the multi-value memory of four values is realized.

It should be noted that a new embodiment can be implemented by combining above embodiments as appropriate. Specifically, the present invention is not limited to the above embodiments or their variations. Embodiments resulting from various modifications of the embodiments or their variations as well as embodiments resulting from combinations of structural elements of the different embodiments or their variations that may be conceived by those skilled in the art are included within the scope of the present invention as long as these do not depart from the essence of the present invention.

INDUSTRIAL APPLICABILITY

A nonvolatile memory element according to the present invention is useful as a nonvolatile memory element used in various electronic devices, such as personal computers or mobile phones.

REFERENCE SIGNS LIST

1 Substrate
2 First electrode
3 Variable resistance layer
3a First oxide region (first tantalum oxide layer)
3b Second oxide region (second tantalum oxide layer)
4 Second electrode
5 Local region
6 High oxygen concentration region
6a First high oxygen concentration region
6b Second high oxygen concentration region
7 Low oxygen concentration region
10 Nonvolatile memory element
100 Nonvolatile memory device
101 Memory main body
102 Memory array
103 Voltage application unit
104R Row selection circuit and driver
104C Column selection circuit
105 Write circuit
106 Sense amplifier
107 Data input and output circuit
108 Cell plate power source
109 Address input circuit
110 Control circuit
200 Nonvolatile memory device
201 Memory main body
202 Memory array
203 Voltage application unit
204R Row selection circuit and driver
204C Column selection circuit and driver
205 Write circuit
206 Sense amplifier
207 Data input and output circuit
208 Address input circuit
209 Control circuit
BL0-BL2 Bit line
M111-M233 Memory cell
PL0-PL2 Plate line
T11-T33 Transistor
WL0-WL2 Word line

The invention claimed is:

1. A nonvolatile memory element comprising:
a first electrode;
a second electrode; and
a variable resistance layer which is located between the first electrode and the second electrode, has a resistance value that reversibly changes according to a voltage value of an electric pulse applied between the first electrode and the second electrode, and comprises a metal oxide,
wherein the variable resistance layer includes a first metal oxide region connected to the first electrode, and a second metal oxide region connected to the second electrode, the second metal oxide region having a second oxygen content atomic percentage higher than a first oxygen content atomic percentage of the first metal oxide region, and
wherein V1, V2, V3, V4, V5, and V6 represent voltage values of the electric pulse with respect to the first electrode having a first relationship of V2>V1>V6>0 V>V5>V3>V4, and R1, R2, R3, and R4 represent resistance values of the variable resistance layer having a second relationship of R3>R2>R4>R1,
the resistance value of the variable resistance layer:
becomes R2, upon the electric pulse having a first voltage value of V2 being applied between the first electrode and the second electrode;
becomes R2, upon the electric pulse having a second voltage value greater than V2 being applied between the first electrode and the second electrode;

becomes R4, upon the electric pulse having a third voltage value of V4 being applied between the first electrode and the second electrode; and becomes R4, upon the electric pulse having a fourth voltage value smaller than V4 being applied between the first electrode and the second electrode, the resistance value of the variable resistance layer at R2:

remains at R2, upon the electric pulse having a fifth voltage value of V5 being applied between the first electrode and the second electrode;

remains at R2, upon the electric pulse having a sixth voltage value greater than V5 being applied between the first electrode and the second electrode;

increases to above R2, upon the electric pulse having a seventh voltage value smaller than V5 and greater than V3 being applied between the first electrode and the second electrode; and becomes R3, upon the electric pulse having an eighth voltage value of V3 being applied between the first electrode and the second electrode, the resistance value of the variable resistance layer at R3:

decreases to below R3, upon the electric pulse having a ninth voltage value smaller than V3 and greater than V4 being applied between the first electrode and the second electrode; and becomes R4, upon the electric pulse having the third voltage value of V4 or the fourth voltage value smaller than V4 being applied between the first electrode and the second electrode, the resistance value of the variable resistance layer at R4:

remains at R4, upon the electric pulse having a tenth voltage value of V6 being applied between the first electrode and the second electrode;

remains at R4, upon the electric pulse having an eleventh voltage value smaller than V6 being applied between the first electrode and the second electrode;

decreases to below R4, upon the electric pulse having a twelfth voltage value greater than V6 and smaller than V1 being applied between the first electrode and the second electrode; and becomes R1, upon the electric pulse having a thirteenth voltage value of V1 being applied between the first electrode and the second electrode, and the resistance value of the variable resistance layer at R1:

increases to above R1, upon the electric pulse having a fourteenth voltage value greater than V1 and smaller than V2 being applied between the first electrode and the second electrode; and becomes R2, upon the electric pulse having the first voltage value of V2 or the second voltage value greater than V2 being applied between the first electrode and the second electrode, wherein the variable resistance layer includes a local region which is in contact with the second electrode and not in contact with the first electrode, and the local region includes:

a first high oxygen concentration region positioned closer to the first electrode than a second high oxygen concentration region;

the second high oxygen concentration region positioned closer to the second electrode than the first high oxygen concentration region; and a low oxygen concentration region which is positioned between the first high oxygen concentration region and the second high oxygen concentration region, and has a third oxygen content atomic percentage lower than a fourth oxygen content atomic percentage of the first high oxygen concentration region and a fifth oxygen content atomic percentage of the second high oxygen concentration region.

2. The nonvolatile memory element according to claim 1, wherein the local region is formed to extend across the first metal oxide region and the second metal oxide region,
the first high oxygen concentration region is formed in the first metal oxide region, and
the second high oxygen concentration region is formed in the second metal oxide region.

3. The nonvolatile memory element according to claim 1, wherein the variable resistance layer comprises a transition metal oxide or an aluminum oxide.

4. The nonvolatile memory element according to claim 1, wherein the first metal oxide region comprises a first oxide having a composition represented by $TaO_x$, and
the second metal oxide region comprises a second oxide having a composition represented by $TaO_y$, where x<y.

5. A nonvolatile memory device including a plurality of the nonvolatile memory elements according to claim 1, the nonvolatile memory device comprising:
a plurality of word lines and a plurality of bit lines, the word lines and the bit lines being formed above a semiconductor substrate and arranged to cross each other, and
a memory array including the nonvolatile memory elements each of which is provided for a corresponding one of cross-points of the word lines and the bit lines.

6. The nonvolatile memory device according to claim 5, further comprising
a plurality of transistors each of which is connected in series to a corresponding one of the nonvolatile memory elements.

7. The nonvolatile memory device according to claim 5, further comprising
a plurality of diodes each of which is connected in series to a corresponding one of the nonvolatile memory elements.

8. A method of writing for use in a nonvolatile memory element,
wherein the nonvolatile memory element includes:
a first electrode;
a second electrode; and
a variable resistance layer which is located between the first electrode and the second electrode, has a resistance value that reversibly changes according to a voltage value of an electric pulse applied between the first electrode and the second electrode, and comprises a metal oxide,
the variable resistance layer includes a first metal oxide region connected to the first electrode, and a second metal oxide region connected to the second electrode, the second metal oxide region having a second oxygen content atomic percentage higher than a first oxygen content atomic percentage of the first metal oxide region, and
wherein V1, V2, V3, V4, V5, and V6 represent voltage values of the electric pulse with respect to the first electrode having a first relationship of V2>V1>V6>0 V>V5>V3>V4, and R1, R2, R3, and R4 represent resistance values of the variable resistance layer having a second relationship of R3>R2>R4>R1,
the resistance value of the variable resistance layer:
becomes R2, upon the electric pulse having a first voltage value of V2 being applied between the first electrode and the second electrode;

becomes R2, upon the electric pulse having a second voltage value greater than V2 being applied between the first electrode and the second electrode;

becomes R4, upon the electric pulse having a third voltage value of V4 being applied between the first electrode and the second electrode; and becomes R4, upon the electric pulse having a fourth voltage value smaller than V4 being applied between the first electrode and the second electrode, the resistance value of the variable resistance layer at R2:

remains at R2, upon the electric pulse having a fifth voltage value of V5 being applied between the first electrode and the second electrode;

remains at R2, upon the electric pulse having a sixth voltage value greater than V5 being applied between the first electrode and the second electrode;

increases to above R2, upon the electric pulse having a seventh voltage value smaller than V5 and greater than V3 being applied between the first electrode and the second electrode; and becomes R3, upon the electric pulse having an eighth voltage value of V3 being applied between the first electrode and the second electrode, the resistance value of the variable resistance layer at R3:

decreases to below R3, upon the electric pulse having a ninth voltage value smaller than V3 and greater than V4 being applied between the first electrode and the second electrode; and becomes R4, upon the electric pulse having the third voltage value of V4 or the fourth voltage value smaller than V4 being applied between the first electrode and the second electrode, the resistance value of the variable resistance layer at R4:

remains at R4, upon the electric pulse having a tenth voltage value of V6 being applied between the first electrode and the second electrode;

remains at R4, upon the electric pulse having an eleventh voltage value smaller than V6 being applied between the first electrode and the second electrode;

decreases to below R4, upon the electric pulse having a twelfth voltage value greater than V6 and smaller than V1 being applied between the first electrode and the second electrode; and becomes R1, upon the electric pulse having a thirteenth voltage value of V1 being applied between the first electrode and the second electrode, and the resistance value of the variable resistance layer at R1:

increases to above R1, upon the electric pulse having a fourteenth voltage value greater than V1 and smaller than V2 being applied between the first electrode and the second electrode; and becomes R2, upon the electric pulse having the first voltage value of V2 or the second voltage value greater than V2 being applied between the first electrode and the second electrode, the method comprising:

upon changing the resistance value of the variable resistance layer from resistance value R1 or resistance value R4 to resistance value R3, applying the electric pulse having the first voltage value of V2 or the second voltage value greater than V2 between the first electrode and the second electrode to change the resistance value of the variable resistance layer to resistance value R2, and subsequently applying the electric pulse having the eighth voltage value of V3 between the first electrode and the second electrode to change the resistance value of the variable resistance layer to resistance value R3; and upon changing the resistance value of the variable resistance layer from resistance value R2 or resistance value R3 to resistance value R1, applying the electric pulse having the third voltage value of V4 or the fourth voltage value smaller than V4 between the first electrode and the second electrode to change the resistance value of the variable resistance layer to resistance value R4, and subsequently applying the electric pulse having the thirteenth voltage value of V1 between the first electrode and the second electrode to change the resistance value of the variable resistance layer to resistance value R1.

* * * * *